(12) United States Patent
Saeki et al.

(10) Patent No.: US 10,074,478 B2
(45) Date of Patent: Sep. 11, 2018

(54) CAPACITOR

(71) Applicant: Murata Manufacturing Co., Ltd., Nagaokakyo-shi, Kyoto-fu (JP)

(72) Inventors: Hiromasa Saeki, Nagaokakyo (JP); Naoki Iwaji, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 43 days.

(21) Appl. No.: 15/224,781

(22) Filed: Aug. 1, 2016

(65) Prior Publication Data

US 2017/0040109 A1    Feb. 9, 2017

(30) Foreign Application Priority Data

Aug. 6, 2015  (JP) ................... 2015-156250

(51) Int. Cl.
| | |
|---|---|
| H01G 4/008 | (2006.01) |
| H01G 4/08 | (2006.01) |
| H01G 4/10 | (2006.01) |
| H01G 4/33 | (2006.01) |
| H01L 49/02 | (2006.01) |

(52) U.S. Cl.
CPC ............. *H01G 4/008* (2013.01); *H01G 4/085* (2013.01); *H01G 4/10* (2013.01); *H01G 4/33* (2013.01); *H01L 28/82* (2013.01)

(58) Field of Classification Search
CPC .......... H01G 4/008; H01G 4/085; H01G 4/10; H01G 4/33; H01L 28/82
USPC ......................................... 361/312
See application file for complete search history.

(56) References Cited

U.S. PATENT DOCUMENTS

| | | | | |
|---|---|---|---|---|
| 2003/0081374 A1* | 5/2003 | Takada | ................. | H01G 9/0036 361/523 |
| 2011/0075322 A1* | 3/2011 | Kuriki | .................... | H01G 11/02 361/502 |
| 2012/0100687 A1* | 4/2012 | Lim | .................. | H01L 27/10855 438/381 |
| 2012/0300369 A1* | 11/2012 | Lee | .......................... | H01G 9/15 361/524 |
| 2016/0329157 A1* | 11/2016 | Takeyama | .............. | H01G 11/38 |

OTHER PUBLICATIONS

G. Fiorentino et al.; "Impact of the atomic layer deposition precursors diffusion on solid-state carbon nanotube based supercapacitors performances"; IOP Publishing, Nanotechnology 26 (2015), pp. 1-11.

* cited by examiner

*Primary Examiner* — Michael P McFadden
(74) *Attorney, Agent, or Firm* — Arent Fox LLP

(57) ABSTRACT

A capacitor that includes a conductive porous base material; an electrode layer; a dielectric layer between the conductive porous base material and the electrode layer; and at least one silicon-containing layer between the dielectric layer and the electrode layer.

16 Claims, 3 Drawing Sheets

CAPACITOR

CROSS REFERENCE TO RELATED APPLICATIONS

The present application claims priority to Japanese Patent Application No. 2015-156250, filed Aug. 6, 2015, the entire contents of which is incorporated herein by reference.

BACKGROUND OF THE INVENTION

Field of the Invention

The present invention relates to a capacitor.

Description of the Related Art

In recent years, with higher-density mounting of electronic devices, capacitors with higher electrostatic capacitance have been required. As such a capacitor, for example, Nanotechnology 26 (2015) 064002 discloses therein a capacitor that has an $Al_2O_3$ layer as a dielectric layer and a TiN layer as an upper electrode layer formed on a porous body composed of a carbon nanotube with the use of an atomic layer deposition method (ALD method: Atomic Layer Deposition).

SUMMARY OF THE INVENTION

In Nanotechnology 26 (2015) 064002, the TiN layer is deposited by an ALD method with the use of a $TiCl_4$ gas and a $NH_3$ gas. However, the inventors have found that when the TiN layer (electrode layer) is formed as just described, chlorine derived from the raw material can remain in the TiN layer, and the residual chlorine has the possibility of decreasing the insulating property of the insulating layer (dielectric layer) and the reliability of the capacitor.

An object of the present invention is to provide a highly reliable capacitor which has an insulating layer unlikely to be adversely affected even when chlorine remains in an electrode layer.

The inventors have found, as a result of making earnest studies in order to solve the problem mentioned above, that the formation of a silicon-containing layer between a dielectric layer and an electrode layer makes it possible to achieve a highly reliable capacitor even when the electrode layer contains residual chlorine.

According to an aspect of the present invention, a capacitor is provided which includes a conductive porous base material; an electrode layer; a dielectric layer between the conductive porous base material and the electrode layer; and at least one silicon-containing layer between the dielectric layer and the electrode layer.

According to the present invention, providing the silicon-containing layer between the dielectric layer and the electrode layer can prevent chlorine contained in the electrode layer from adversely affecting the dielectric layer. As a result, a highly reliable capacitor can be provided.

DETAILED DESCRIPTION OF THE INVENTION

Capacitors according to the present invention will be described in detail below with reference to the drawings. However, the capacitor according to the present embodiment and the shapes and arrangement of respective constructional elements are not limited to the examples shown in the figures.

Figure 1:
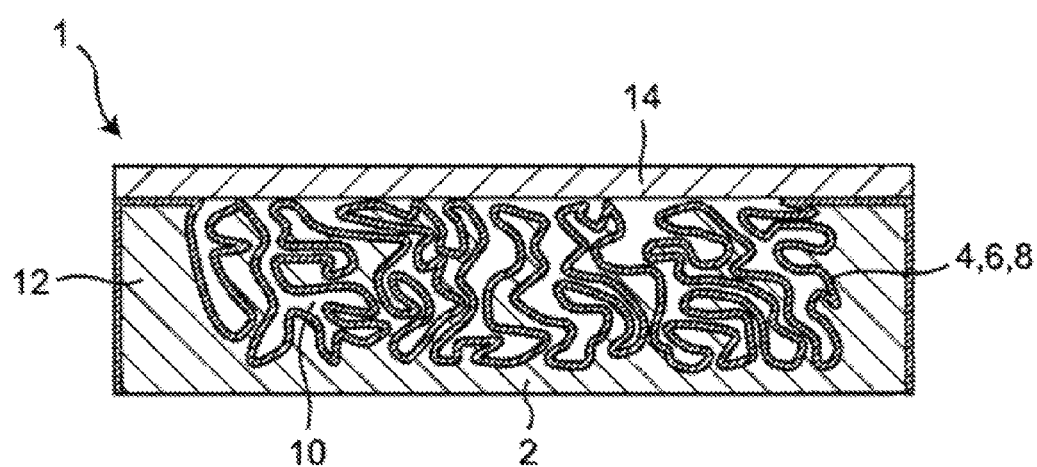
FIG. 1 is a schematic cross-sectional view of a capacitor 1 according to an embodiment of the present invention.
Figure 2:
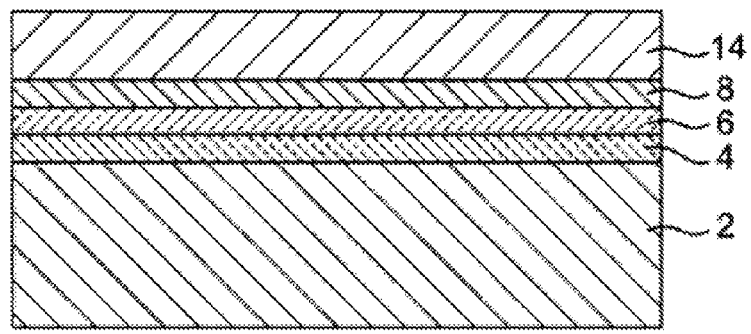
FIG. 2 is a diagram schematically illustrating a layered structure in the capacitor 1.

FIG. 1 shows a schematic cross-sectional view of a capacitor 1 according to the present embodiment, and FIG. 2 schematically shows the layered structure (that is, the layered structure of a conductive porous base material 2, a dielectric layer 4, a silicon-containing layer 6, and an upper electrode layer 8) of the capacitor 1. The capacitor 1 according to the present embodiment has a substantially cuboid shape, and as shown in FIGS. 1 and 2, schematically has the conductive porous base material 2 including a porous part 10 and a low-porosity part 12, the dielectric layer 4 formed thereon, the silicon-containing layer 6 formed on the dielectric layer 4, the upper electrode layer 8 formed on the silicon-containing layer 6, and an extension electrode 14 formed thereon to be electrically connected to the upper electrode layer 8. The conductive porous base material 2 can function as an electrode, and is opposed to the upper electrode layer 8 with the dielectric layer 4 and silicon-containing layer 6 interposed therebetween. Charges can be accumulated in the dielectric layer 4 and the silicon-containing layer 6 by applying a voltage to the conductive porous base material 2 and the upper electrode layer 8.

The conductive porous base material 2 has a porous part 10 including a large number of pores. The porosity in the porous part 10 can be preferably 20% or more, more preferably 30% or more, further preferably 50% or more, and yet further preferably 60% or more. Increasing the porosity can further increase the capacitance of the capacitor. In addition, from the perspective of increasing the mechanical strength, the porosity of the porous part 10 can be preferably 90% or less, and more preferably 80% or less.

The term "porosity" in this specification refers to the proportion of voids in the porous part. It is to be noted that while the dielectric layer, the upper electrode layer, and the like can be present in pores of the porous part, the porosity in this specification means the porosity in the absence of the dielectric layer, the upper electrode layer, and the like, that is, the porosity in consideration of only the conductive porous base material. The porosity can be measured in the following way.

A sample of the porous part for TEM (Transmission Electron Microscope) observation is prepared by a FIB (Focused Ion Beam) micro-sampling method. A region of approximately 3 μm×3 μm in a cross section of the sample is subjected to measurement by STEM (Scanning Transmission Electron Microscopy)—EDS (Energy Dispersive X-ray Spectrometry) mapping analysis. The proportion of the area without the base material is regarded as the porosity in the visual field of the mapping analysis. This measurement is made at any three locations, and the average value for the measurement values is regarded as a porosity.

Although the porous part 10 is not particularly limited, the porous part 10 preferably has an expanded surface ratio of 30 times or more and 10,000 times or less, more preferably 50 times or more and 5,000 times or less, for example, 200 times or more and 600 times or less. In this regard, the expanded surface ratio refers to the surface area per unit projected area. The surface area per unit projected area can be typically obtained from the amount of nitrogen adsorption at a liquid nitrogen temperature with the use of a BET specific surface area measurement system.

Figure 4A:
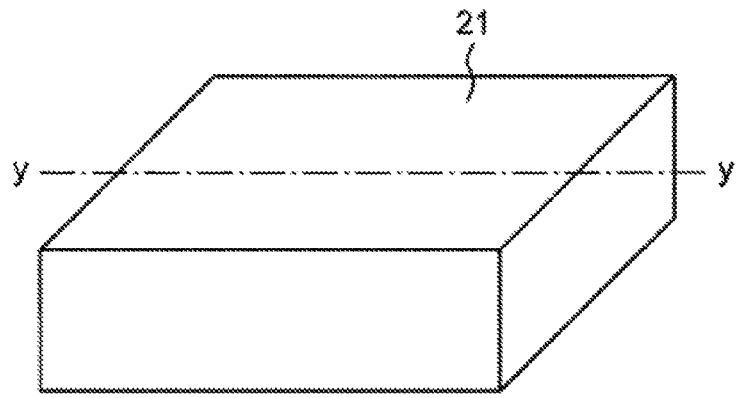
FIGS. 4A to 4D are diagrams for explaining a method for calculating the expanded surface ratio of a porous part.
Figure 4B:
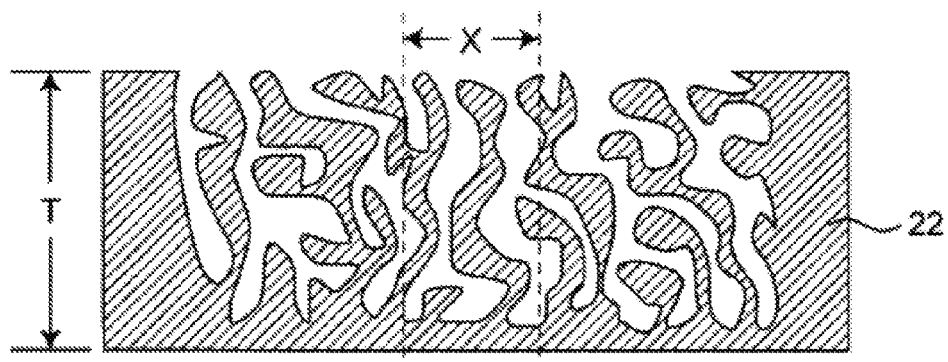
Figure 4C:
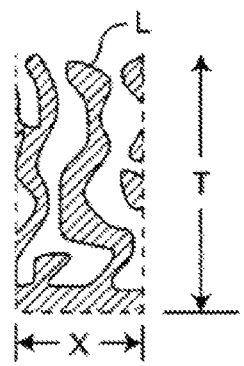
Figure 4D:
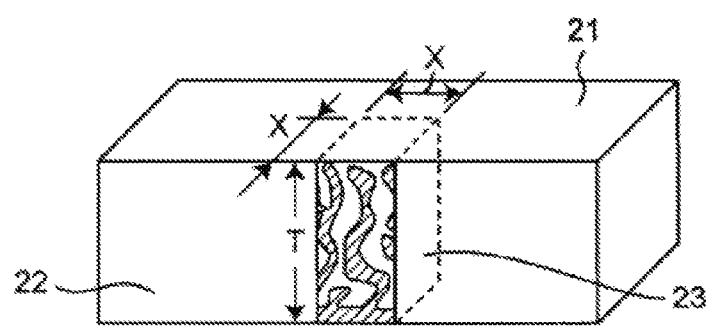

In addition, the expanded surface ratio can also be obtained by the following method. A STEM (scanning transmission electron microscope) image of a cross section of the sample (a cross section obtained by cutting in the thickness direction; see FIGS. 4A and 4B) is taken over the entire area in width X and thickness (height) T directions (multiple images may be connected when it is not possible to take the image at a time). Measured is the total path length L of the pore surface (the total length of the pore surface) at the obtained cross section of the width X×the height T (see FIG. 4C). In this regard, the total path length of the pore surface is denoted by LX in the square prism (see FIG. 4D) with the cross section of the width X×the height T as a side surface and the porous base material surface as a bottom. In addition, the area of the base of the square prism is referred to as $X^2$.

Accordingly, the expanded surface ratio can be obtained from $LX/X^2 = L/X$.

The conductive porous base material 2 has the low-porosity part 12. While the low-porosity part 12 is illustrated on either side of the conductive porous base material 2 in FIG. 1, the low-porosity part 12 is present to surround the porous part 10. More specifically, the low-porosity part is also present in front of and behind the drawing. The low-porosity part 12 is a region that is lower in porosity than the porous part 10. It is to be noted that there is no need for the low-porosity part 12 to have pores.

The low-porosity part 12 contributes to improved mechanical strength of the capacitor. The porosity of the low-porosity part 12 is preferably 60% or less of the porosity of the porous part 10, and more preferably 50% or less of the porosity of the porous part 10, from the perspective of increasing the mechanical strength. For example, the porosity of the low-porosity part 12 is preferably 20% or less, and more preferably 10% or less. In addition, the low-porosity part 12 may have a porosity of 0%.

It is to be noted the conductive porous base material 2 according to the present embodiment has the low-porosity part 12, but the part is not an essential element. Further, even in the case of providing the low-porosity part 12, there is no particular limitation in terms of presence location, the number of parts located, size, shape, and the like.

The material and composition of the conductive porous base material 2 are not limited as long as the porous part 10 has a conductive surface. For example, the conductive porous base material 2 may be a conductive metallic porous base material formed from a conductive metal, or a porous base material including a conductive layer formed on a surface of a porous part of a non-conductive porous material, such as a porous silica material, a porous carbon material, or a porous ceramic sintered body.

In a preferred embodiment, the conductive porous base material 2 is a conductive metallic porous base material, and examples of the metal constituting the conductive metallic porous base material include, for example, metals such as aluminum, tantalum, nickel, copper, titanium, niobium, and iron, and alloys such as stainless steel and duralumin. Preferably, the conductive porous base material 2 is an aluminum porous base material.

Although the conductive porous material 2 has the porous part only at one principal surface in the present embodiment, the present invention is not limited thereto. More specifically, the porous part may be present at two principal surfaces. In addition, the porous part is not particularly limited in terms of presence location, the number of parts located, size, shape, and the like.

In the capacitor 1 according to the present embodiment, the dielectric layer 4 is formed on the conductive porous base material 2.

The material that forms the dielectric layer 4 is not particularly limited as long as the material has an insulating property, and preferably, examples thereof include: metal oxides such as $AlO_x$ (typically $Al_2O_3$), $AlTiO_x$, $HfO_x$, $TaO_x$, $ZrO_x$, $TiZrO_x$, $TiZrWO_x$, $TiO_x$, $SrTiO_x$, $PbTiO_x$, $BaTiO_x$, $BaSrTiO_x$, and $BaCaTiO_x$; metal nitrides such as $AlN_x$, $SiN_x$, and $AlScN_x$; and metal oxynitrides such as $AlO_xN_y$, $AlO_x$ (typically $Al_2O_3$) is preferred. It is to be noted that the formulas mentioned above are merely intended to represent the constitutions of the materials, but not intended to limit the compositions. More specifically, the x and y attached to O and N may have any value larger than 0, and the respective elements including the metal elements may have any presence proportion.

The thickness of the dielectric layer 4 is not particularly limited, and for example, preferably 5 nm or more and 100 nm or less, and more preferably 10 nm or more and 50 nm or less. The adjustment of the thickness of the dielectric layer to 5 nm or more can enhance the insulating property, thereby making it possible to further reduce the leakage current. In addition, the adjustment of the thickness of the dielectric layer to 100 nm or less makes it possible to achieve higher electrostatic capacitance.

The dielectric layer is preferably formed by a gas phase method, for example, a vacuum deposition method, a chemical vapor deposition (CVD: Chemical Vapor Deposition) method, a sputtering method, an atomic layer deposition (ALD: Atomic Layer Deposition) method, a pulse laser deposition (PLD: Pulsed Laser Deposition) method, or the like. Because a more homogeneous and denser film can be formed even in fine pores of the porous member, the CVD method or the ALD method is more preferred, and the ALD method is particularly preferred.

In the capacitor 1 according to the present embodiment, the silicon-containing layer 6 is formed on the dielectric layer 4.

The silicon-containing layer 6 may have a single layer, or multiple layers. In addition, the silicon-containing layer 6 can also serve as a dielectric layer.

Examples of the material that forms the silicon-containing layer 6 preferably include $SiO_x$, $SiTiO_x$, $HfSiO_x$, $ZrSiO_x$, and $SiAlO_x$, and $SiO_x$ (typically $SiO_2$) is preferred. Layers of these materials can be formed at relatively low temperatures (for example, temperatures of 300° C. or lowers), and can be thus used in a preferred manner even when the other members, for example, the base material and the like are weak against high temperatures. It is to be noted that the formulas mentioned above are merely intended to represent the constitutions of the materials, but not intended to limit the compositions. More specifically, the x attached to O may have any value larger than 0, and the respective elements including the metal elements may have any presence proportion.

The thickness of the silicon-containing layer 6 is not particularly limited, and for example, preferably 5 nm or more and 100 nm or less, and more preferably 10 nm or more and 50 nm or less. The reliability of the capacitor can be further improved by making the thickness of the silicon-containing layer 5 nm or more. In addition, higher electrostatic capacitance can be achieved by making the thickness of the silicon-containing layer 100 nm or less.

The silicon-containing layer 6 is preferably formed by a gas phase method, for example, a vacuum deposition method, a chemical vapor deposition (CVD: Chemical Vapor Deposition) method, a sputtering method, an atomic layer deposition (ALD: Atomic Layer Deposition) method, a pulse laser deposition (PLD: Pulsed Laser Deposition) method, or the like. Because a more homogeneous and denser film can be formed even in fine pores of the porous member, the CVD method or the ALD method is more preferred, and the ALD method is particularly preferred.

The silicon-containing layer has a great anti-diffusion effect, and can have the function of preventing, for example, the diffusion of residual chlorine from the upper electrode layer to the dielectric layer, the diffusion of metal atoms such as Ti from the upper electrode layer to the dielectric layer, and the diffusion of oxygen from the dielectric layer to the upper electrode layer. This function can stabilize the dielectric layer and the upper electrode layer, and improve the reliability of the capacitor.

In the capacitor 1 according to the present embodiment, the upper electrode layer 8 is formed on the silicon-containing layer 6.

The material constituting the upper electrode layer 8 is not particularly limited as long as the material is conductive, and examples thereof include, Ni, Cu, Al, W, Ti, Ag, Au, Pt, Zn, Sn, Pb, Fe, Cr, Mo, Ru, Pd, and Ta and alloys thereof, e.g., CuNi, AuNi, AuSn, and metal nitrides and metal oxynitrides such as TiN, TiAlN, TiON, TiAlON, TaN, conductive polymers (for example, PEDOT(poly(3,4-ethylenedioxythiophene)), polypyrrole, polyaniline), TiN or TiON is preferred, and TiN is more preferred.

The thickness of the upper electrode layer 8 is not particularly limited, and for example, 3 nm or more, and more preferably 10 nm or more. The adjustment of the thickness of the upper electrode layer to 3 nm or more can reduce the resistance of the upper electrode layer itself.

The upper electrode layer 8 can be formed by a method that can coat the silicon-containing layer, for example, a method such as an ALD method, a chemical vapor deposition (CVD: Chemical Vapor Deposition) method, plating, bias sputtering, a Sol-Gel method, and conductive polymer filling. Preferably, the upper electrode layer is formed by an ALD method. The use of the ALD method can increase the capacitance of the capacitor.

In an embodiment, the upper electrode layer may be formed in a way that a conductive film is formed by an ALD method on the silicon-containing layer, and thereon, pores are filled by another approach with a conductive substance, preferably a substance that is lower in electrical resistance. This configuration can achieve a higher capacitance density and a lower equivalent series resistance (ESR: Equivalent Series Resistance) in an effective manner. In another embodiment, pores of the porous part may be filled with TiN.

In a preferred embodiment, the upper electrode layer is a TiN layer formed by an ALD method with the use of, as reaction gases, a $TiCl_4$ (titanium tetrachloride) gas and an ammonia ($NH_3$) gas. The TiN layer formed by such a method can contain chlorine derived from the raw material. Essentially, the residual chlorine in the TiN layer is preferably reduced, and in the capacitor including the silicon-containing layer according to the present invention, the chlorine content in the TiN layer is not particularly limited, but even allowed to be, for example, 0.3 to 8.0%.

In the capacitor 1 according to the present embodiment, the extension electrode 14 is formed on the upper electrode layer 8.

The material constituting the extension electrode 14 is not particularly limited, but example thereof include, for example, metals such as Au, Pb, Ag, Sn, Ni, and Cu, and alloys, as well as conductive polymers.

The method for forming the extension electrode 14 is not particularly limited, but for example, a CVD method, electrolytic plating, electroless plating, vapor deposition, sputtering, baking of a conductive paste, and the like can be used, and electrolytic plating, electroless plating, vapor deposition, sputtering, and the like are preferred.

This capacitor can prevent diffusion of atoms (for example, Cl, O, other metal atoms such as Ti) between the dielectric layer 4 and the upper electrode layer 8, because the silicon-containing layer 6 is formed between the dielectric layer 4 and the upper electrode layer 8. In addition, the silicon-containing layer 6 can achieve the anti-diffusion function mentioned above even when the film is formed at a relatively low temperature (for example, 300° C. or lower), and thus prevent deformations of the base material, degradation of the other layers, and the like due to high-temperature treatments, without requiring any high-temperature treatment. Therefore, the capacitor according to the present invention can have high reliability.

In a preferred embodiment, for the capacitor, the base material is an aluminum porous base material, the dielectric layer is an $Al_2O_3$ layer, the silicon-containing layer is a $SiO_2$ layer, and the upper electrode layer is a TiN layer. Preferably, the dielectric layer, the silicon-containing layer, and the upper electrode layer are each formed by an ALD method.

While the capacitor according to the present invention has been described above with reference to the capacitor 1 according to the embodiment as mentioned above, the present invention is not limited thereto, and various modifications can be made thereto.

For example, the capacitor according to the present invention has only to have the silicon-containing layer between the dielectric layer and the upper electrode layer in the porous part, and may have a layer other than the layers presented in the embodiment described above.

In an embodiment, another layer may be present between the base material and the dielectric layer.

In another embodiment, another layer may be present between the dielectric layer and the silicon-containing layer, or between the upper electrode layer and the silicon-containing layer.

In another embodiment, another layer may be present between the upper electrode layer and the extension electrode.

In another embodiment, a silicon-containing layer, a dielectric layer, a silicon-containing layer, and an electrode layer may be further formed on the upper electrode layer.

EXAMPLE

Preparation of Conductive Porous Base Material

Aluminum foil was prepared, and subjected to varied etching, thereby preparing two types of aluminum etching foil (base material A and base material B) that were different in porosity. In addition, aluminum foil subjected to no etching was prepared (base material C).

The porosity of the aluminum etching foil of the base material A and the base material B was measured in the following way.

The base material A and the base material B were processed by an FIB micro-sampling method with a focused ion beam system (SM13050SE from SII NanoTechnology, Inc.), thereby, achieving processing into thin sections for approximately 50 nm in thickness, and thus preparing samples for STEM (Scanning Transmission Electron Microscope) observation. Further, the FIB damage layers produced in processing into the thin section were removed with the use of an Ar ion milling system (PIPS model1691 from GATAN, Inc.).

A region of approximately 3 μm×3 μm in a cross section of the sample was subjected to STEM (Scanning Transmission Electron Microscopy)—EDS (Energy Dispersive X-ray Spectrometry) mapping analysis, thereby measuring the proportion (porosity) of the area without the base material in the visual field of the mapping analysis. This measurement was made at any three points, and the average value for the measurement results at the three points was regarded as the porosity. The porosity of the base material A was 42.7%, and the porosity of the base material B was 21.1%.

Preparation of Sample

On the three types of aluminum foil (base material A to C), an $Al_2O_3$ layer (thickness: 15 nm) as a dielectric layer was formed by an ALD method. Specifically, a step of alternately supplying a trimethyl aluminum ($Al(CH_3)_3$) gas and a water vapor ($H_2O$) gas to the base materials was repeated a predetermined number of times, thereby forming an $Al_2O_3$ layer on the base materials.

Next, on the $Al_2O_3$ layer, a $SiO_2$ layer (thickness: 15 nm) as a silicon-containing layer was formed by an ALD method. Specifically, a step of alternately supplying tris dimethylamino silane ($SiH[N(CH_3)_2]_3$) and a water vapor ($H_2O$) gas was repeated a predetermined number of times, thereby forming a $SiO_2$ layer on the $Al_2O_3$ layers.

Next, on the $SiO_2$ layer, a TiN layer (thickness: 10 nm) as an upper electrode layer was formed by an ALD method. Specifically, a step of alternately supplying a $TiCl_4$ (titanium tetrachloride) gas and an ammonia ($NH_3$) gas was repeated a predetermined number of times, thereby forming a TiN layer on the $SiO_2$ layers.

Finally, the samples prepared in the way mentioned above were immersed in an electroless Cu plating bath to form extension electrodes (thickness: 10 μm) of Cu plated layers on the upper electrode layers, thereby preparing capacitor samples (Examples 1 to 2, Comparative Example 1) structured as shown in FIGS. 1 and 2.

Figure 3:
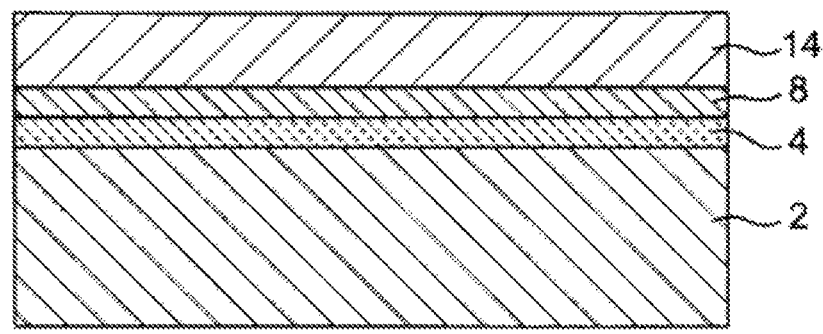
FIG. 3 is a diagram schematically illustrating a layered structure in capacitors according to Comparative Examples 2 to 4.

In addition, capacitor samples (comparative examples 2 to 4) were prepared which were structured as with Examples 1 to 2 and Comparative Example 1 except for the film structure shown in FIG. 3, in accordance with the same procedure except that an $Al_2O_3$ (thickness: 10 nm) was formed in place of the $SiO_2$ layer (that is, the thickness was 25 nm in combination with the dielectric layer).

(Evaluation of Sample)

For fifteen samples according to each of Examples 1 to 2 and Comparative Examples 1 to 4, which were prepared in the way described above, a direct-current voltage was applied at a rate of voltage increase: 1 V/sec between the porous base material and the upper electrode layer to measure the breakdown voltage. The results are shown in Table 1.

TABLE 1

| Sample Number | Aluminum Foil | Porosity (%) | Breakdown Field Intensity (V) | |
|---|---|---|---|---|
| | | | Average | Standard Deviation σ |
| Example 1 | A | 42.7 | 21.2 | 3.78 |
| Example 2 | B | 21.1 | 16.1 | 4.01 |
| Comparative Example 1 | C | — | 24.6 | 2.45 |
| Comparative Example 2 | A | 42.7 | 4.2 | 0.287 |
| Comparative Example 3 | B | 21.1 | 4.7 | 0.632 |
| Comparative Example 4 | C | — | 23.8 | 1.37 |

As shown in Table 1 above, Comparative Examples 2 and 3 using the porous base materials A and B were significantly low in breakdown field intensity, as compared with Comparative Example 4 using the non-porous base material C. This is believed to be caused by the decreased quality of the dielectric layer, for reasons such as the fact that the ingress of raw material gases into pores is unlikely to be caused when the base material is porous. On the other hand, Examples 1 and 2 with the silicon-containing layer formed between the dielectric layer and the upper electrode layer were significantly high in breakdown field intensity, as compared with Comparative Examples 2 and 3 without any silicon-containing layer. This is believed to be because the silicon-containing layer ($SiO_2$ layer) suppresses the diffusion of residual chlorine contained in the upper electrode layer, which is considered as one of causes that degrade the dielectric layer, into the dielectric layer of $Al_2O_3$. It is to be noted that when the base material is not porous, it is believed that a high breakdown field intensity can be achieved even without having any silicon-containing layer, because a high-quality $Al_2O_3$ film can be formed over the entire surface of the base material.

The capacitor according to the present invention is, because of its remarkable stability and high reliability, used for various electronic devices in a preferred manner.

What is claimed is:

1. A capacitor comprising:
   a conductive porous base material;
   an electrode layer;
   a dielectric layer between the conductive porous base material and the electrode layer; and
   at least one silicon-containing layer between the dielectric layer and the electrode layer,
   wherein the conductive porous base material includes a first porosity part and a second porosity part, the first porosity part having a porosity 60% or less of that of the second porosity part.

2. The capacitor according to claim 1, wherein the electrode layer contains chlorine.

3. The capacitor according to claim 1, wherein the electrode layer is an atomic deposition layer.

4. The capacitor according to claim 1, wherein the electrode layer comprises TiN.

5. The capacitor according to claim 4, wherein the electrode layer contains chlorine.

6. The capacitor according to claim 1, wherein the dielectric layer comprises $Al_2O_3$.

7. The capacitor according to claim 1, wherein the at least one silicon-containing layer comprises $SiO_2$.

8. The capacitor according to claim 1, wherein the at least one silicon-containing layer is an atomic deposition layer.

9. The capacitor according to claim 1, wherein the conductive porous base material is an aluminum porous base material.

10. The capacitor according to claim 1, wherein the second porosity part has a porosity of 20% or more.

11. The capacitor according to claim 1, wherein the second porosity part has a porosity of 40% or more.

12. The capacitor according to claim 1, wherein the second porosity part has a porosity of 20% to 90%.

13. The capacitor according to claim 1, wherein the second porosity part has a porosity of 60% to 80%.

14. The capacitor according to claim 1, wherein
the electrode layer comprises TiN and contains chlorine,
the dielectric layer comprises $Al_2O_3$,
the at least one silicon-containing layer comprises $SiO_2$, and
the conductive porous base material is an aluminum porous base material.

15. The capacitor according to claim 1, further comprising an extension electrode in electrical connection with the electrode layer.

16. The capacitor according to claim 1, wherein a material of the at least one silicon-containing layer is selected from the group consisting of $SiO_x$, $SiTiO_x$, $HfSiO_x$, $ZrSiO_x$, and $SiAlO_x$, wherein x is greater than 0.

* * * * *